(12) United States Patent
Berger et al.

(10) Patent No.: US 8,080,925 B2
(45) Date of Patent: Dec. 20, 2011

(54) INERTIAL SENSOR WITH DUAL CAVITY PACKAGE AND METHOD OF FABRICATION

(75) Inventors: William Paul Berger, Martinez, CA (US); Mark Andrew Collins, Antioch, CA (US); Michael Thomas Frazee, Martinez, CA (US); Thad W. (Marc) Smith, Antioch, CA (US); Robert Albert Anderson, Walnut Creek, CA (US); Stuart John Knowles, Walnut Creek, CA (US); Victor Dragotti, Danville, CA (US)

(73) Assignee: Custom Sensors & Technologies, Inc., Moorpark, CA (US)

( * ) Notice: Subject to any disclaimer, the term of this patent is extended or adjusted under 35 U.S.C. 154(b) by 274 days.

(21) Appl. No.: 12/236,156

(22) Filed: Sep. 23, 2008

(65) Prior Publication Data
US 2010/0072862 A1    Mar. 25, 2010

(51) Int. Cl.
*H01L 41/08* (2006.01)

(52) U.S. Cl. ......... 310/370; 310/329; 310/348; 310/344

(58) Field of Classification Search .................. 310/370, 310/344, 348, 329, 311; 73/493, 514.29, 73/514.32, 804.12; H01L 41/08
See application file for complete search history.

(56) References Cited

U.S. PATENT DOCUMENTS

| | | | |
|---|---|---|---|
| 6,262,520 B1 | 7/2001 | Knowles | |
| 6,534,711 B1 | 3/2003 | Pollack | |
| 6,748,807 B2 * | 6/2004 | Yoshiuchi et al. | 73/493 |
| 6,917,142 B2 * | 7/2005 | Koyama et al. | 310/344 |
| 2001/0054860 A1 * | 12/2001 | Knowles | 310/370 |
| 2004/0017004 A1 * | 1/2004 | Kasai et al. | 257/704 |
| 2007/0101812 A1 * | 5/2007 | MacGugan | 73/493 |
| 2009/0322183 A1 * | 12/2009 | Kawakubo et al. | 310/329 |

FOREIGN PATENT DOCUMENTS
EP    1813951 A1    8/2007

* cited by examiner

*Primary Examiner* — Thomas Dougherty
*Assistant Examiner* — Karen B Addison
(74) *Attorney, Agent, or Firm* — Edward S. Wright

(57) ABSTRACT

Inertial sensor having a body with first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry.

20 Claims, 5 Drawing Sheets

Fig. 2
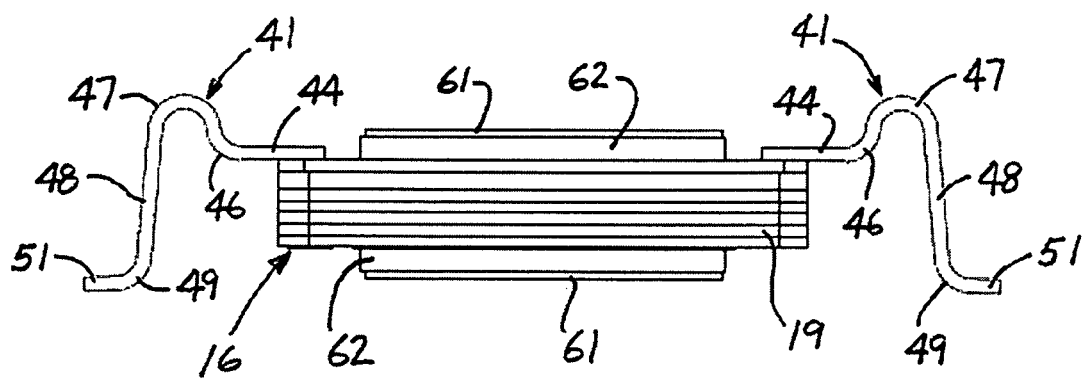
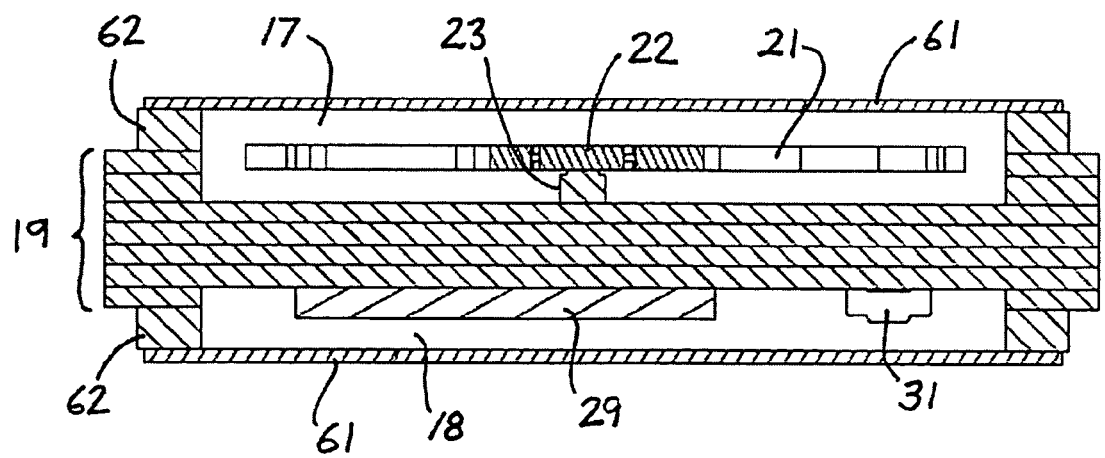
Fig. 3

Fig. 7
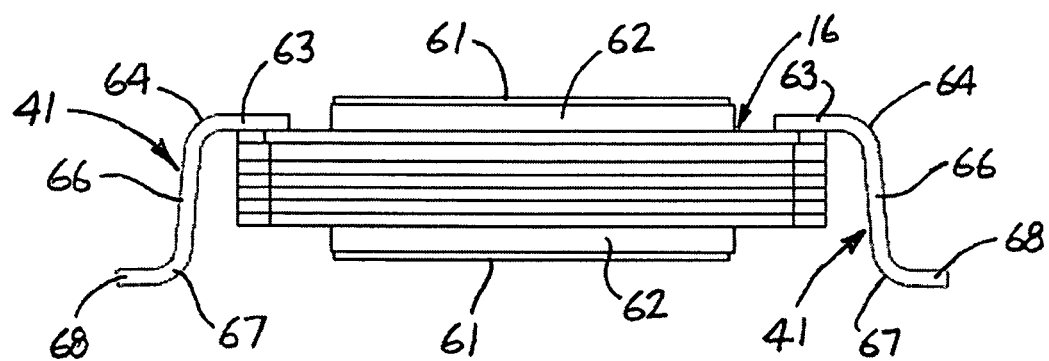
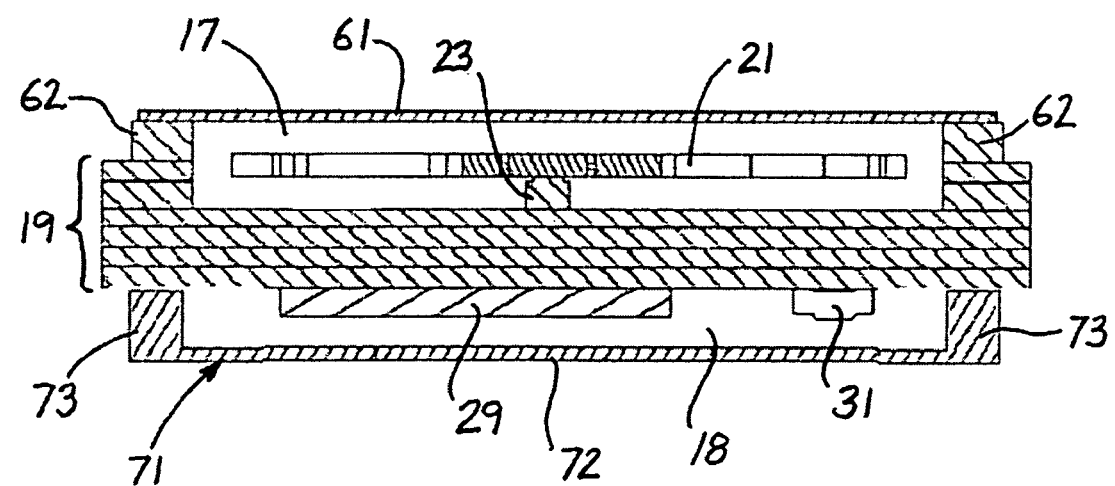
Fig. 8

INERTIAL SENSOR WITH DUAL CAVITY PACKAGE AND METHOD OF FABRICATION

BACKGROUND OF THE INVENTION

1. Field of Invention

This invention relates generally to inertial sensors and, more particularly, to the packaging of such sensors.

2. Related Art

In order to function properly, inertial sensing elements commonly require a controlled environment such as very low pressure or vacuum, low humidity, and/or a specific gas. In order to maintain such environments over the life of a sensor, it is usually necessary to hermetically enclose the sensing element within a package or cavity. In addition, electronics associated with the sensing element must also be protected from moisture, which typically requires a separate package or enclosure or over-molding with a moisture resistant compound.

In sensors of the prior art, the sensing elements are often individually enclosed within packages of their own. These packages can be of the same material as the sensing elements, as, for example, in micromachined silicon devices that include hermetically sealed caps. Alternatively, the sensing element can be sealed in a package made of a different material, e.g. a quartz or silicon tuning fork mounted in a sealed ceramic package.

The sensing elements and associated electronics, such as integrated circuits and passive components, are often mounted side-by-side on a substrate. This increases the necessary surface area of the substrate, which increases cost and size of the sensor. It also complicates routing of traces to connect the sensing elements and electronic components.

Moreover, depending on how the components are arranged, separate testing of the individual components of a sensor can be difficult or impossible. When the components cannot be tested separately, it may be necessary to reject an entire assembly even if only one of the components is faulty, and scrapping functional components along with the bad adds unnecessarily to the cost of the product. This difficulty arises even when sensing elements and electronics are mounted in a vertical arrangement such as a tuning fork positioned above an integrated circuit in a cavity. If there is a problem with the sensing element, the relatively costly integrated circuit is scrapped as well.

Over-molding compounds, such as silicone gel or plastic, are commonly used to protect the sensing element, electronic elements, and interconnections from moisture. The materials and processes involved in over-molding introduce additional cost, complexity, and the potential for additional failure modes, and the over-molding is done in addition to any hermetic seals enclosing the individual sensing elements.

OBJECTS AND SUMMARY OF THE INVENTION

It is in general an object of the invention to provide a new and improved inertial sensor and method of fabricating the same.

Another object of the invention is to provide an inertial sensor and method of the above character which overcome the limitations and disadvantages of the prior art.

These and other objects are achieved in accordance with the invention by providing an inertial sensor having a body with first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry.

BRIEF DESCRIPTION OF THE DRAWINGS

FIG. 2 is an elevational view of the embodiment of FIG. 1.

FIG. 3 is a cross-sectional view of the embodiment of FIG. 1.

FIG. 7 is an elevational view, similar to FIG. 2, of another embodiment of an inertial sensor according to the invention.

FIG. 8 is a cross-sectional view, similar to FIG. 3, of another embodiment of an inertial sensor according to the invention.

DETAILED DESCRIPTION

Figure 1:
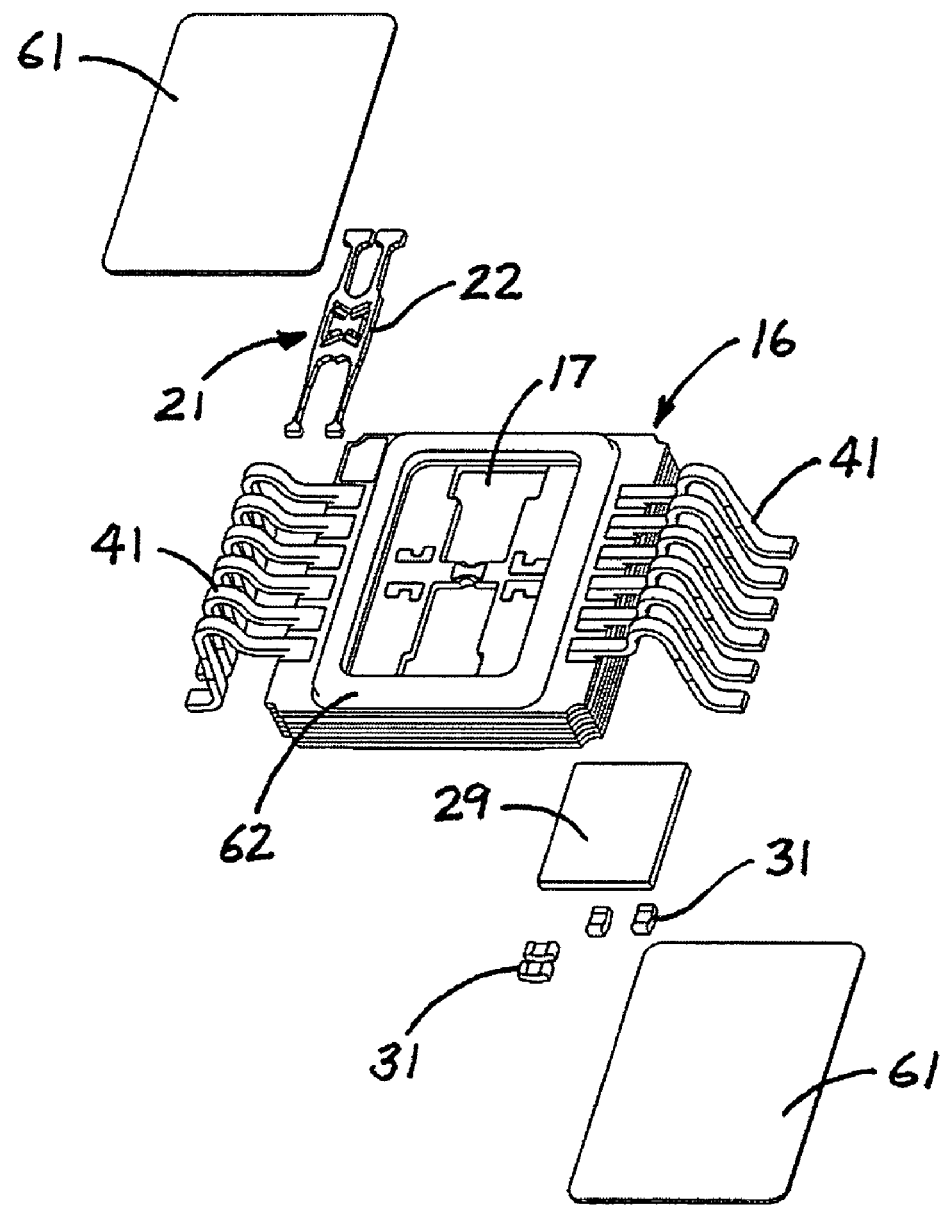
FIG. 1 is an exploded isometric view of one embodiment of an inertial sensor according to the invention.

As illustrated in FIGS. 1-3, the sensor has a relatively flat, generally planar body 16 with cavities 17, 18 on opposite sides thereof. The body is preferably formed of an insulative material, and in the embodiment illustrated, it consists of a stack of ceramic layers or laminations 19. The layered structure is advantageous in that the body can have any desired height or thickness, and the routing of conductive traces is simplified since they can be placed between the laminations or layers, as can grounded conductors that provide shielding between sensing elements and electronic components in the cavities.

Cavity 17 extends into the ceramic body to a depth sufficient to contain one or more sensing elements with clearance above and below them, and cavity 18 extends to a depth sufficient to contain the electronic circuitry and associated components.

The sensing element or elements can, for example, be one or more angular rate sensors and/or one or more acceleration sensors. Multiple angular rate sensing elements could provide either redundant angular rate data for one axis of rotation or separate angular rate data for different axes of rotation, or both. Similarly, the accelerometers could be sensitive to one or more axes of acceleration. In the embodiment illustrated, the sensing element is a double-ended quartz tuning fork 21 for sensing angular rate, as disclosed, for example, in U.S. Pat. No. 6,262,520. This tuning fork has a centrally located mounting area or base 22 which is mounted on a pedestal 23 that is formed as an integral part of the ceramic body.

Figure 4:
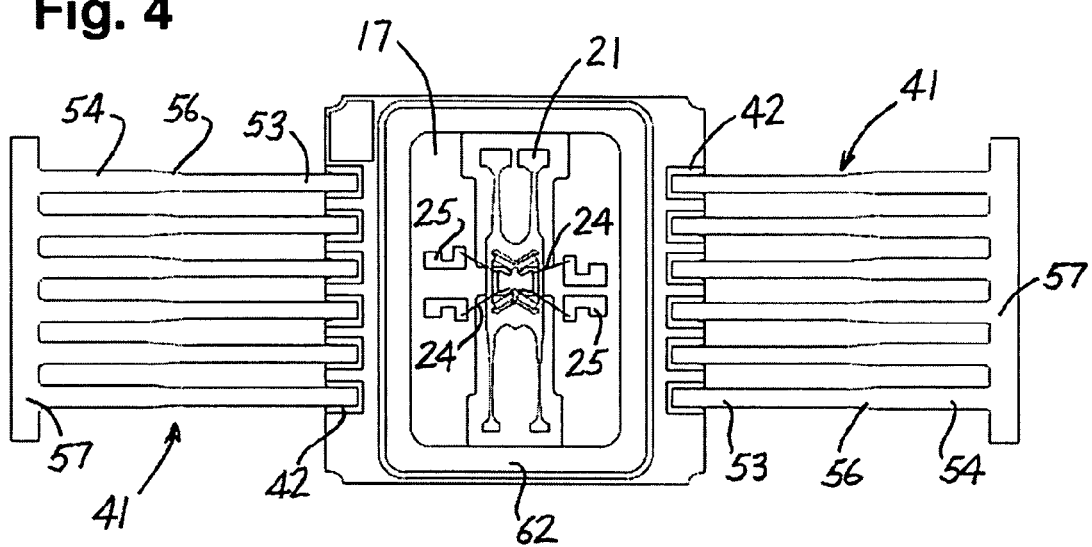
FIG. 4 is a top plan view of the embodiment of FIG. 1 at one stage of the fabrication process.

As illustrated in FIG. 4, electrical connections with the sensing element are made by bonding wires 24 which extend between the sensing element and conductive traces 25 on the bottom wall of cavity 17 that interconnect with electronic circuitry in cavity 18 via conductive traces in the ceramic body. Alternatively, input/output bonding pads on the sensing element can be attached directly to mating conductive traces on the pedestal to form a conducting bond at each of the bonding pads. The bonds can be made with any suitable conductive material such as a eutectic solder or conductive adhesive.

Figure 5:
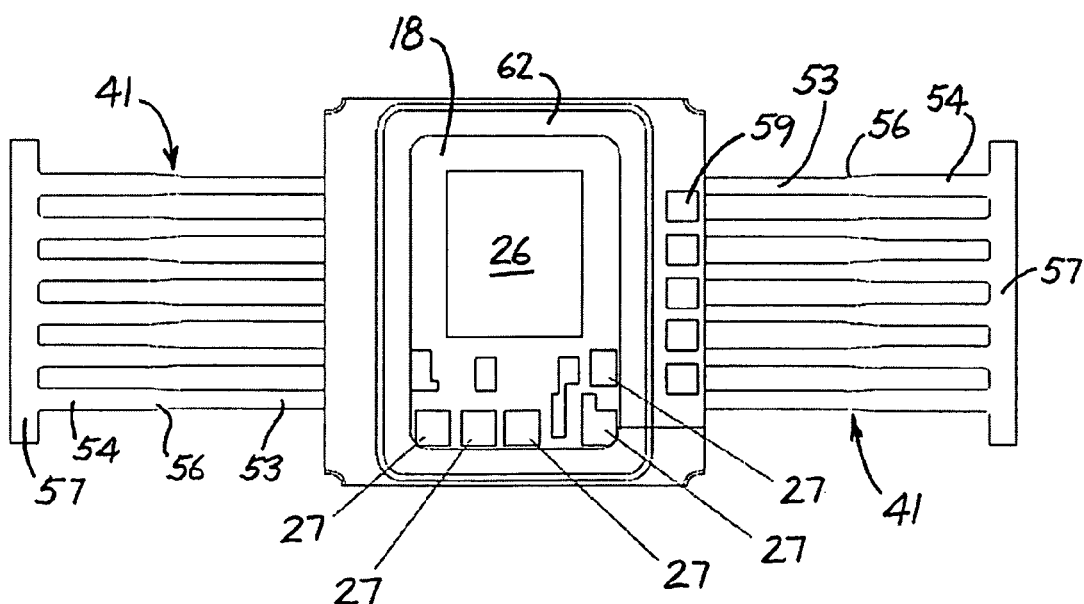
FIGS. 5 and 6 are bottom plan views of the embodiment of Figure at different stages of the fabrication process.

As illustrated in FIG. 5, cavity 18 includes a mounting area 26 for one or more application-specific integrated circuits (ASIC's) and a plurality of test points 27 for testing the sensing element in cavity 17. These test points are connected to conductive traces 25 and, hence, to the sensing element via conductive traces in the ceramic body. With a piezoelectric quartz tuning fork for sensing angular rate, two test points are provided for the drive portion of the sensing element, two test points are provided for the pickup portion, and an additional test point is provided for ground potential. External probes (not shown) can be used to contact the test points to verify that the sensing element is functioning correctly after cavity 17 has been sealed or when direct access to the sensing element is otherwise not possible.

Figure 6:
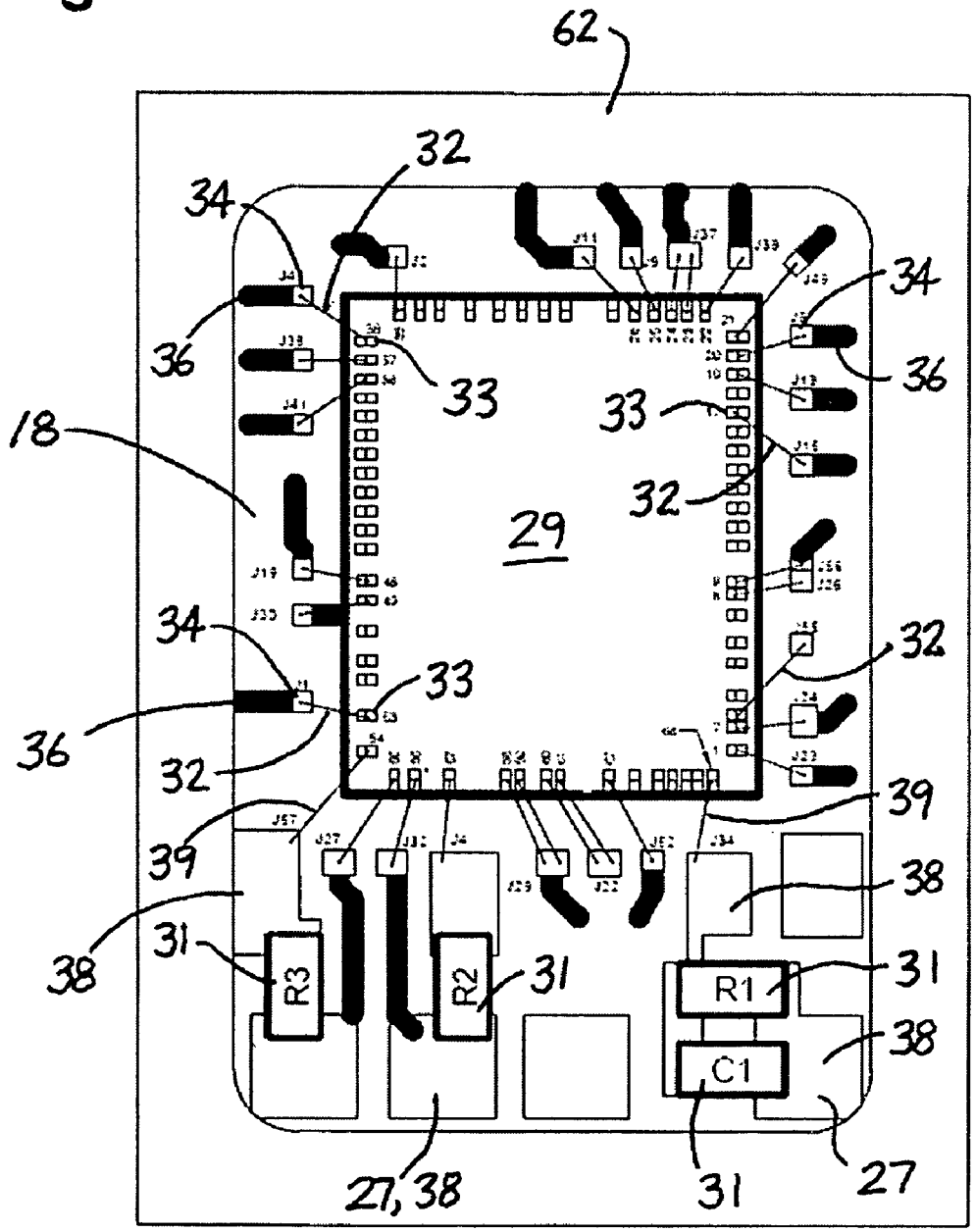

FIG. 6 shows component cavity 18 with an integrated circuit 29 and a plurality of associated components 31, such as resistors and capacitors, mounted therein. Electrical connections with the integrated circuit are made by bonding wires 32 that extend between the input/output pads 33 of the integrated circuit and conductive pads 34 and traces 36 on the bottom wall of the cavity. Interconnecting traces (not shown) connected to the conductive traces or pads pass through and between the layers of the ceramic body to provide signal routing for the integrated circuit.

Components 31 are mounted on and connected to conductive lands 38 on the bottom wall of cavity 18 outside the area occupied by the integrated circuit. Connections between the integrated circuit and the components are made by bonding wires 39 that extend between the input/output pads of the integrated circuit and the conductive lands. In the embodiment illustrated, some of the conductive lands are connected to the sensing element and used as test points in steps as trimming, balancing, calibration, functional testing, and verifying performance of the sensing element during device fabrication.

Alternatively, the integrated circuit can be positioned with its input/output pads facing the ceramic body and being connected directly to pads on the ceramic body, thereby eliminating the need for wirebonds to make electrical connections with the integrated circuit. The connections between the pads on the integrated circuit and the pads on the body can be made by any suitable means such as re-flow of solder bumps.

External electrical connections to the sensor are made through leads 41 which are attached to pads 42 on opposite sides of cavity 17 on the upper side of the ceramic body. These pads are connected to the electronic circuitry in cavity 18 via traces in the ceramic body, with some of the leads being used for supplying power to the sensor, while others are used for data. The leads are attached to the pads by conventional means such as brazing, and they serve as the means for mounting the sensor on a circuit board or other structure in addition to being conductors.

Leads 41 are preferably formed with two or more inflections, or bends, in order to provide additional flexibility for maximum decoupling of the ceramic body from motions of the circuit board or other structure to which it is attached. The overall shape, dimensions and stiffness of the leads can be adjusted to provide optimal decoupling and provide a separation between resonant frequencies of the package and leads and those of the sensing element. Such decoupling is of particular importance with inertial sensors which detect motions such as rotation and acceleration.

In the embodiment of FIG. 1, the leads have three inflections along their length. As best seen in FIG. 2, the leads have a first section 44 that extends laterally from the body, a first curved section 46 that curves upwardly from the first curved section, a second curved section 47 that curves downwardly from the first curved section, a downwardly and outwardly inclined section 48 that extends from the second curved section, a third curved section 49 that curves outwardly from the lower end of the downwardly and outwardly inclined section, and a foot section 51 that extends outwardly or laterally from the third curved section.

In this embodiment, the leads are also formed with sections of different width in order to provide maximum separation between resonant frequencies of the package and leads and those of the sensing element. Thus, as best seen in FIGS. 4 and 5, each of the leads has a relatively narrow inner end section 53 near the body of the sensor, a wider outer end section 54, and a tapered section 56 between the end sections. It has been found that leads having more than two inflections and a varied width provide improved decoupling and thereby make the sensor resistant to disturbances due to externally applied vibration and shock inputs.

As manufactured, the leads are formed in sets with the leads extending from headers 57 at their outer ends. After the inner ends of the leads have been attached to the bonding pads on the body, the headers are trimmed off and the leads are bent to the desired configuration.

While most signals to and from the sensor electronics pass through the leads, additional interface pads 59 are also provided. These pads are connected to conductive traces in the ceramic body and provide access to one or more electrical circuits within the sensor. The additional interface pads can be used for diagnostics, calibration, and/or other sensor programming functions, particularly those performed during manufacture of the device. In the embodiment illustrated, the pads are located to one side of the cavity on the under side of body 16, i.e. the side opposite the bonding pads for the leads.

The two cavities are covered and hermetically sealed by lids 61 to maintain the desired atmosphere within each cavity. The lids are mounted on generally rectangular sealing rings 62 which surround the cavities and are affixed to the upper and lower faces of the body. Both the lids and the sealing rings are preferably made of a Fe—Ni—Co alloy such as ASTM F15, and, if desired, the lids can be plated with a corrosion resistant metal such as nickel. The sealing rings are affixed to the body by brazing to provide hermetic seals between the rings and the body, and the lids are attached to the rings by conventional means such as welding to provide hermetic seals between the lids and the rings. If desired, the sealing rings can be omitted and the lids attached directly to the ceramic body by brazing or other suitable means.

In the preferred method of manufacture, the sensing element is installed in cavity 17, any required adjustments of the element are performed (e.g., trimming or balancing), and the lid is installed on that cavity before the electronic components are installed in cavity 18. This permits the sensing element to be tested via the test points 27 in cavity 18 after the installation and wiring of the sensing element have been completed. The electronic components are then installed in cavity 18, and the lid is installed to seal that cavity, too. After both lids have been attached, the individual leads in each set are separated from the header, and the leads are then formed to the desired contour.

Calibration of the included sensing element can be performed after assembly of the device by programming an internal memory in the electronics. The programming can be done by means of signals carried through leads 41 and/or the additional interface pads 59.

The sensor can provide either digital or analog output signals, or both. In the preferred embodiment, serial digital data is provided using an SPI (Serial Peripheral Interface) protocol. Auxiliary signals from ancillary devices or other sensors can be input to one or more of the leads 41 and/or the additional interface pads 59. Data from these auxiliary signals can be provided along with the primary sensor data, using the same digital output of the primary sensor.

The embodiment illustrated in FIG. 7 is generally similar to the embodiment of FIG. 1, and like reference numerals designate corresponding elements in the two embodiments. In the embodiment of FIG. 7, however, leads 41 are formed with only two inflections. Each lead has a first section 63 that extends laterally from the body, a first curved section 64 that extend downwardly from the first section, a downwardly and outwardly inclined section 66 that extends from the first curved section, a second curved section 67 that extends outwardly from the lower end of the downwardly and outwardly inclined section, and a foot section 68 that extends outwardly from the second curved section.

The embodiment of FIG. 8 is likewise generally similar to the embodiment of FIG. 1, and like reference numerals designate corresponding elements in the two embodiments. In the embodiment of FIG. 8, however, lower cavity 18 is formed in a lid 71 rather than in the ceramic body. Lid 71 has a generally planar outer wall 72 spaced from and generally parallel to the lower face of the body and a peripheral side wall 73 between the outer wall and the body. The outer wall and side wall are formed as a unitary, integral structure, with the inner or upper edge of the side wall being hermetically sealed to the ceramic body. Lid 71 can be made of ceramic material similar to the ceramic body or of another material such as an Fe—Ni—Co alloy. If made of such an alloy, the lid can be plated with a corrosion resistant metal such as nickel.

If desired, upper cavity 17 can also be formed within a cavity-forming lid similar to lid 71, or upper cavity 17 can be formed in that manner, with cavity 18 formed in the ceramic body. It is also possible to form either or both of the cavities with a flat lid and a sealing ring of suitable height on the surface of a flat ceramic body, or by any combination of ceramic bodies, sealing rings and lids.

The invention has a number of important features and advantages. The sensor is well suited to be manufactured by low cost, automated techniques. The sensing element and electronic components can be positioned and attached to their corresponding mounting areas in the ceramic body using well-known techniques, such as automated pick-and-place equipment, and they can be bonded to their mounting locations using any of a variety of conventional methods, including adhesive or eutectic solder bonds. Moreover, as discussed above, the sensing element can be tested after it has been installed and prior to installation of the electronic components.

The layered structure of the ceramic body is advantageous in that the body can have any desired height or thickness, and the routing of conductive traces is simplified since they can be placed between the laminations or layers, as can grounded conductors that provide shielding between sensing elements and electronic components in the cavities.

With the two hermetically sealed cavities, the sensing element and the electronic components are in their own dry environments with the appropriate backfill gas for each. No over-molding compounds or conformal coating are required to protect the components.

It is apparent from the foregoing that a new and improved inertial sensor and method of fabrication have been provided. While only certain presently preferred embodiments have been described in detail, as will be apparent to those familiar with the art, certain changes and modifications can be made without departing from the scope of the invention as defined by the following claims.

The invention claimed is:

1. An inertial sensor, comprising: a body having a plurality of layers of insulative material bonded together to form first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry.

2. The inertial sensor of claim 1 wherein the body consists of a stack of ceramic layers laminated together.

3. The inertial sensor of claim 1 including test points which are disposed in the second cavity, connected electrically to the sensing element, and accessible to external test probes.

4. The inertial sensor of claim 1 wherein the sensing element is selected from the group consisting of an angular rate sensing element, an acceleration sensing element, and combinations thereof.

5. The inertial sensor of claim 1 wherein the sensing element is a piezoelectric tuning fork.

6. The inertial sensor of claim 1 including additional interface pads mounted on the outside of the body and connected to the electronic circuitry.

7. The inertial sensor of claim 1 including a lid which covers the cavity on one side of the body and a sealing ring between the body and the lid.

8. The inertial sensor of claim 7 wherein the body is fabricated of ceramic material, the sealing ring and lid are fabricated of a metal alloy, the sealing ring is affixed to the body by brazing, and the lid is hermetically sealed to the ring.

9. The inertial sensor of claim 1 wherein one of the cavities is formed at least in part by a lid having an outer wall spaced from the body and a peripheral side wall between the outer wall and the body.

10. An inertial sensor, comprising: a body having first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry, the leads being formed to have at least two inflections and vary in width to make the sensor insensitive to externally applied vibration and shock.

11. An inertial sensor, comprising: a body having first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry, each of the leads having a first section that extends laterally from the body, a downwardly curved section extending from the first section, a downwardly and outwardly inclined section extending from the downwardly curved section, an outwardly curved section extending from the downwardly and outwardly inclined section, and a foot section extending outwardly from the outwardly curved section.

12. An inertial sensor, comprising: a body having first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry, each of the leads having a first section that extends laterally from the body, an upwardly curved section extending from the first section, a downwardly curved section extending from the upwardly curved section, a downwardly and outwardly inclined section extending from the downwardly curved section, an outwardly curved section extending from the downwardly and outwardly inclined section, and a foot section extending outwardly from the outwardly curved section.

13. An inertial sensor, comprising: a body having first and second cavities on opposite sides thereof, a sensing element in the first cavity, electronic circuitry in the second cavity, electrical conductors interconnecting the sensing element and the circuitry, and leads connected electrically to the circuitry and extending from the body for mounting the sensor and making connections with the circuitry, each of the leads having an inner end portion near the body, an outer end portion wider than the inner end portion, and a tapered portion between the end portions.

14. An inertial sensor, comprising: a body having first and second cavities on opposite sides thereof, a sensing element in the first cavity, electronic circuitry in the second cavity, electrical conductors interconnecting the sensing element and the circuitry, test points which are disposed in the second cavity and connected electrically to the sensing element for testing the sensing element when the first cavity is closed, leads connected electrically to the circuitry and extending from the body for mounting the sensor and making connections with the circuitry, and interface pads mounted on the outside of the body for making additional connections with the circuitry.

15. The inertial sensor of claim 14 wherein the leads are formed to have at least two inflections and vary in width to make the sensor insensitive to externally applied vibration and shock.

16. The inertial sensor of claim 14 wherein each of the leads has a first section that extends laterally from the body, a downwardly curved section extending from the first section, a downwardly and outwardly inclined section extending from the downwardly curved section, an outwardly curved section extending from the downwardly and outwardly inclined section, and a foot section extending outwardly from the outwardly curved section.

17. The inertial sensor of claim 14 wherein each of the leads has a first section that extends laterally from the body, an upwardly curved section extending from the first section, a downwardly curved section extending from the upwardly curved section, a downwardly and outwardly inclined section extending from the downwardly curved section, an outwardly curved section extending from the downwardly and outwardly inclined section, and a foot section extending outwardly from the outwardly curved section.

18. The inertial sensor of claim 14 wherein each of the leads has an inner end portion near the body, an outer end portion wider than the inner end portion, and a tapered portion between the end portions.

19. The inertial sensor of claim 14 wherein the leads are formed to have at least two inflections and vary in width to make the sensor insensitive to externally applied vibration and shock.

20. An inertial sensor, comprising: a body having first and second cavities on opposite sides thereof, a sensing element in the first cavity, electronic circuitry in the second cavity, electrical conductors interconnecting the sensing element and the circuitry, test points which are disposed in the second cavity and connected electrically to the sensing element for testing the sensing element when the first cavity is closed, leads connected electrically to the circuitry and extending from the body for mounting the sensor and making connections with the circuitry, and interface pads mounted on the outside of the body for making additional connections with the circuitry, each of the leads being formed to have at least two inflections and vary in width to make the sensor insensitive to externally applied vibration and shock.

* * * * *